United States Patent
Hu et al.

(10) Patent No.: US 6,830,953 B1
(45) Date of Patent: Dec. 14, 2004

(54) SUPPRESSION OF MOSFET GATE LEAKAGE CURRENT

(75) Inventors: Chenming Hu, Alamo, CA (US); Yee-Chia Yeo, Albany, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/245,428

(22) Filed: Sep. 17, 2002

(51) Int. Cl.[7] .................. H01L 21/00; H01L 21/336
(52) U.S. Cl. .................. 438/105; 438/59; 438/264; 438/301; 438/302
(58) Field of Search .................. 438/59, 82, 105, 438/257, 264, 301, 302, 197, 289, 299, 303, 279, 172, 140, 147, 269

(56) References Cited

U.S. PATENT DOCUMENTS

| | | | | |
|---|---|---|---|---|
| 4,717,685 A | * | 1/1988 | Nakajima | 438/172 |
| 4,753,895 A | | 6/1988 | Mayer et al. | 437/21 |
| RE33,584 E | * | 5/1991 | Mimura | 257/194 |
| 5,406,094 A | * | 4/1995 | Arimoto et al. | 257/24 |
| 5,430,310 A | * | 7/1995 | Shibasaki et al. | 257/190 |
| 5,510,279 A | | 4/1996 | Chien et al. | 437/41 |
| 5,670,790 A | * | 9/1997 | Katoh et al. | 257/14 |
| 5,886,368 A | * | 3/1999 | Forbes et al. | 257/77 |
| 6,031,263 A | * | 2/2000 | Forbes et al. | 257/315 |
| 6,066,880 A | * | 5/2000 | Kusunoki | 257/379 |
| 6,133,603 A | * | 10/2000 | Nomoto | 257/315 |
| 6,146,926 A | | 11/2000 | Bhatnagar et al. | 438/140 |
| 6,261,886 B1 | | 7/2001 | Houston | 438/217 |
| 6,307,775 B1 | * | 10/2001 | Forbes et al. | 365/185.01 |
| 6,309,907 B1 | * | 10/2001 | Forbes et al. | 438/105 |
| 6,492,676 B2 | * | 12/2002 | Kusunoki | 257/316 |
| 6,531,751 B1 | * | 3/2003 | Abusch-Magder et al. | 257/412 |
| 6,548,825 B1 | * | 4/2003 | Yoshii et al. | 257/24 |
| 6,586,797 B2 | * | 7/2003 | Forbes et al. | 257/325 |
| 6,599,804 B2 | * | 7/2003 | Bulucea et al. | 438/301 |

OTHER PUBLICATIONS

S.–H. Lo et al., "Quantum–Mechanical Modeling of Electron Tunneling Current from the Inversion Layer of Ultra–Thin–Oxide in MOSFET's," IEEE Electron Device Letters, vol. 18, No. 5, May 1997, pp. 209–211.

X. Huang et al., "Sub 50–nm Fin FET: PMOS," IEDM Technical Digest, Washington, D.C., Dec. 5–8, 1999, pp. 67–70.

D.A. Buchanan et al., "80 nm poly–silicon gated n–FETs with ultra–thin $Al_2O_3$ gate dielectric for ULSI applications," IEDM Tech. Digest, Washington D.C., Dec. 5–8, 1999, pp. 223–226.

C.I. Wu et al., GaN (0001)–(1×1) surfaces:Composition and Electronic Properties, J. Appl. Phys., vol. 83, No. 8, Apr. 15, 1998, pp. 4249–4252.

H. Mimura et al., "Enhancement in electron emission from poly–crystalline silicon field emitter arrays coated with diamond like carbon," J. Appl. Phys., vol. 84, No. 6, Sep. 15, 1998, pp. 3378–3381.

(List continued on next page.)

Primary Examiner—Michael Lebentritt
(74) Attorney, Agent, or Firm—Haynes and Boone, LLP

(57) ABSTRACT

A method for forming a MOSFET having greatly reduced leakage current between the gate electrode and the channel, source and drain regions. The method requires the use of gate electrode materials having lower electron affinities than the channel, source and drain regions. Gate electrode materials with negative electron affinities will also achieve the objectives of the invention. The use of these gate electrode materials enables the band structures of the gate electrode and the other regions to be aligned in a manner that eliminates tunneling states for carriers tunneling between the gate and the body of the device.

14 Claims, 3 Drawing Sheets

OTHER PUBLICATIONS

V.M. Bermudez et al., "AlN films on GaN: Sources of Error in the Photoemission Measurement of Electron Affinity," J. Appl. Phys., vol. 89, No. 3, Feb. 1, 2001, p. 1991.

C. Ronning et al., "Structural and Electronic Properties of Boron Nitride Thin Films Containing Silicon," J. Appl. Phys., vol. 84, No. 9, Nov. 1, 1998, pp. 5046–5051.

J. van der Weide et al., "Negative–electron–affinity Effects on the Diamond (100) surface," Phys. Rev. B., vol. 50, No. 8, Aug. 15, 1994—II, pp. 5803–5806.

* cited by examiner

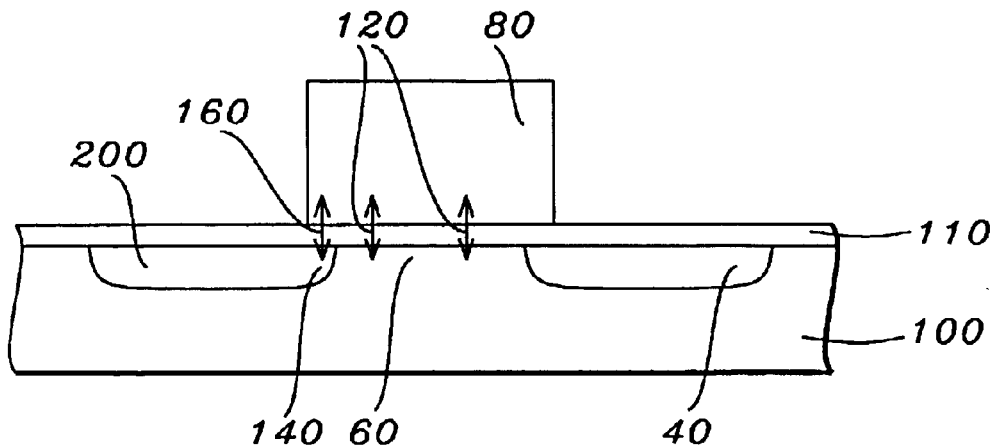
FIG. 1
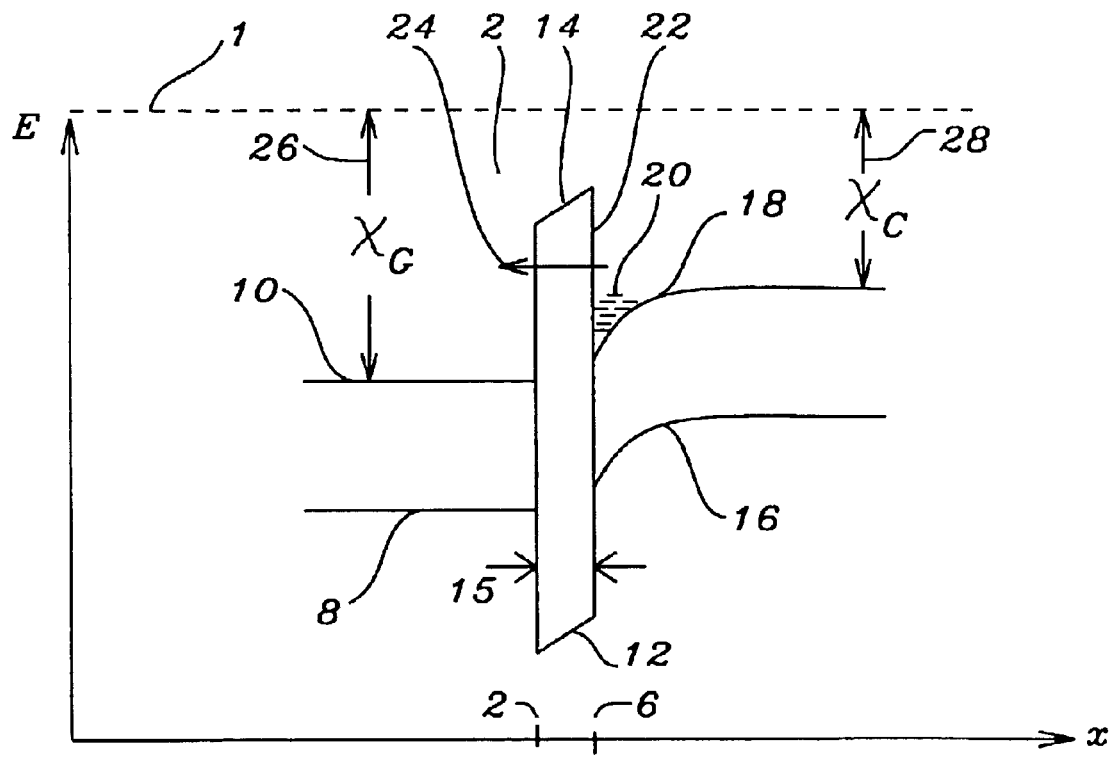
FIG. 2 – Prior Art

SUPPRESSION OF MOSFET GATE LEAKAGE CURRENT

BACKGROUND OF THE INVENTION

1. Field of the Invention

This invention relates generally to the fabrication of MOSFETs, and more particularly to the selection and method of use of novel materials to suppress gate leakage currents in these devices under various operating conditions as their dimensions are reduced.

2. Description of the Related Art

As the dimensions of MOSFETS (Metal Oxide Semiconductor Field-Effect Transistors) continue to shrink, the reduced length of the channel between source and drain causes unwanted side-effects (short-channel effects) due to the increased electric field intensity therein. One way in which such effects have been addressed is by forming an asymmetric lightly doped drain within the transistor, a method taught by Chien et al. (U.S. Pat. No. 5,510,279). Another way of alleviating these side-effects is by reducing the thickness of the oxide layer between the gate electrode and the semiconductor surface. This suppresses the short channel effects and also allows $V_{DD}$ (drain supply voltage) to be reduced while maintaining an acceptable drain current. However, the thin dielectric layer also has disadvantages, most notably allowing power-consuming leakage currents between the gate and the source, drain and channel regions the transistor within the semiconductor. These difficulties are pointed out by S.-H. Lo et al ("Quantum-Mechanical Modeling of Electron Tunneling Current from the Inversion Layer of Ultra-Thin-Oxide nMOSFETs," IEEE Electron Device Letters, Vol. 18, No. 5, May 1997, p. 209). One approach to reducing undesirable gate leakage currents is by forming the channel region in a moat-like shape, with a central region beneath the gate being more heavily doped to create, therein, a high threshold-voltage ($V_T$). This method is taught by Houston (U.S. Pat. No. 6,261,886 B1). Another approach to reducing gate leakage currents is the use of dielectric materials with high dielectric constants (high-k dielectrics), such as $HfO_2$, $Al_2O_3$ and $La_2O_3$. The use of such dielectrics, while producing encouraging results, has proven to be difficult to integrate within present processing methods while still maintaining good channel interface quality and high carrier mobility. A discussion of this high-k dielectric approach is to be found in D. A. Buchanan et al. ("80 nm poly-silicon gated n-FETs with ultra thin $Al_2O_3$ gate dielectric for ULSI applications," IEDM Technical Digest, Washington D.C., Dec. 5–8, 1999, pp. 223–226).

An alternative approach, which is embodied in the present invention, reduces gate leakage currents by gate-material engineering, which is the selection of gate materials (eg. doped semiconductor materials) whose band structures can be matched to the band structures of the source, drain and channel regions of the substrate portions of the transistor so that the tunneling states, required for leakage currents to exist, are made unavailable during various operating conditions of the transistor. This approach can be used to suppress gate leakage currents not only in MOSFETS of standard configuration, but also in SOI (Silicon on Insulator) MOSFETS with single gates or double gates such as are described by X. Huang et al. ("Sub 50-nm FinFet: PMOS" IEDM Technical Digest, Washington D.C., Dec. 5–8, 1999, pp. 67–70). It should also be pointed out that the use of SOI technology, most notably SOS (Silicon on Sapphire) technology has already been applied to the reduction of leakage currents between neighboring device structures (see, in this regard, Mayer et al. (U.S. Pat. No. 4,753,895), but this approach is not applicable to eliminating leakage currents within the device itself, which is the object of the present invention. It should also be noted that the choice of metal gate materials for forming MOS gate terminals, as opposed to Schottky type terminals, is also applied to device fabrications in SiC substrates as taught by Bhatnagar et al. (U.S. Pat. No. 6,146,926), so the method of the present invention would be applicable even in that case.

SUMMARY OF THE INVENTION

The primary object of this invention is to provide a method for significantly reducing gate leakage currents under a variety of operating conditions within a MOSFET having a thin gate dielectric.

In accord with the objects of this invention there is provided a method for significantly reducing source, drain and channel-to-gate leakage currents by effectively eliminating states within the gate electrode and the transistor channel, source and drain regions between which carriers can tunnel. The method involves gate-material engineering, selecting a particular gate electrode material, channel material and dielectric material such that there can be obtained an alignment of their band structures that makes the availability and/or the accessibility of charge-carrier tunneling states energetically extremely difficult or impossible. Thus:

1. When the full supply voltage, $V_{DD}$, is applied to the gate, so that the transistor is under maximum inversion bias, the accumulated carriers in the gate (holes, assuming a $p^+$ doped semiconductor gate material for an n-channel transistor) will have no accessible states within the channel to allow tunneling.

2. When the full supply voltage, $V_{DD}$, is applied to the gate, so that the transistor is under maximum inversion bias, the carriers (electrons) in the channel will have no tunneling states accessible to them in the gate to allow tunneling.

3. When the full supply voltage, $V_{DD}$, is applied to the gate and zero bias is applied to the source, the accumulation carriers in the source will have no tunneling states available in the gate and/or the accumulation carriers in the gate will have no available tunneling states available in the source (assuming here a $p^+$ gate and an $n^+$ source) for leakage currents to be produced in the gate/source overlap region.

4. When the full supply voltage $V_{DD}$ is applied to the drain and the gate is at zero bias, both the gate and drain regions in the gate/drain overlap region will be depleted of charge carriers. In this condition the lack of free carriers in the vicinity of the gate dielectric will significantly reduce or eliminate leakage current between the gate and drain in the overlap region.

It will be shown that gate electrodes formed of prior art materials, such as heavily n-doped polysilicon, cannot achieve these objects. The present invention will demonstrate that low electron affinity materials and negative electron affinity materials can achieve these objects.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

FIG. 1 is a schematic cross-sectional diagram of a portion of an n-channel MOSFET, showing the gate-dielectricsubstrate and the region between gate and channel where leakage occurs and also showing the region of gate/source overlap where leakage occurs.

FIG. 2 (prior art) is a schematic diagram showing the energy band structure of the gate-dielectric-channel region of an n-channel MOSFET biased at the threshold condition. The dielectric is very thin but the gate material has not been selected to achieve the objects of the present invention. The tunneling between accumulated carriers in the channel and the gate is indicated.

DESCRIPTION OF THE PREFERRED EMBODIMENT

Figure 3:
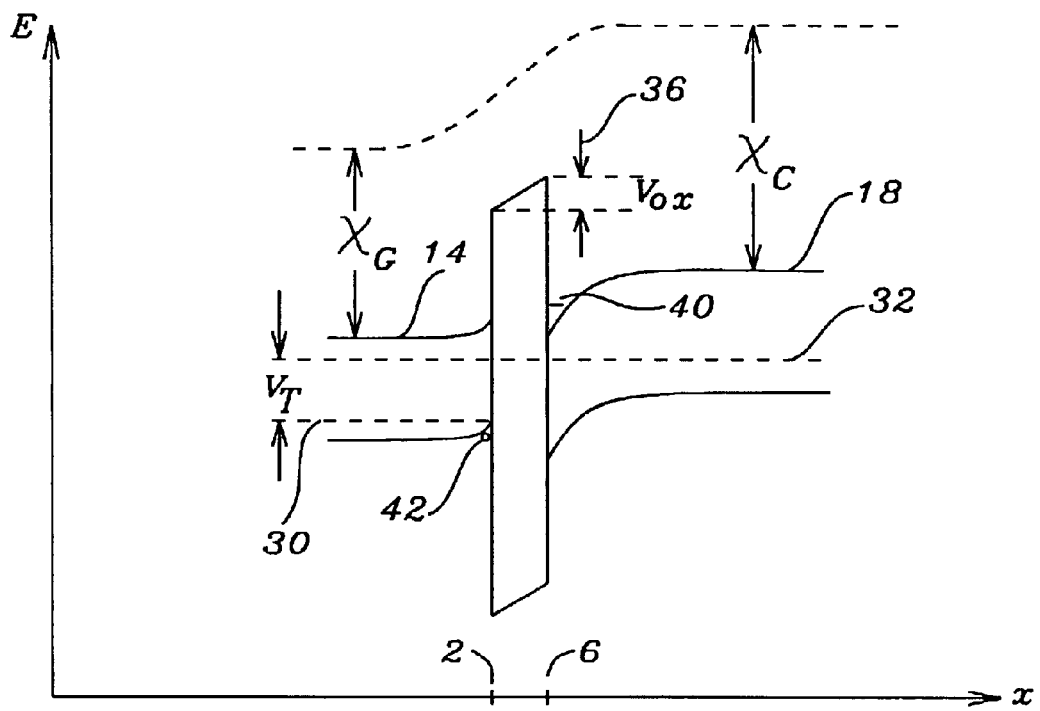
FIG. 3 is a schematic diagram showing the energy band structure of the gate-dielectric-channel region of an n-channel MOSFET biased at the threshold condition. The dielectric is very thin and the gate material has been selected to achieve the objects of the present invention.

The preferred embodiment of the present invention provides a method of significantly reducing undesirable leakage currents between the gate electrode of a MOSFET and its channel, source or drain regions. It is understood that the MOSFET has a very thin dielectric layer between the gate and body of the substrate, so the mechanism for leakage currents is primarily carrier tunneling between the gate and the other regions of the transistor, across the dielectric layer. It is further understood that such tunneling can occur only when there are available states for the charge carrier to tunnel to. The lack of available states in the region to which the carrier is tunneling will produce a zero probability of tunneling. It is the object of this invention to effectively eliminate these available states by properly matching the energy band diagrams of the gate electrode material and the material of the channel region (or source region). In the following description, the preferred embodiment will be described in the context of, first, a prior art nMOSFET, having a gate electrode formed of heavily n-doped semiconductor material, such as polysilicon, formed on a silicon oxide dielectric layer. The dielectric layer is itself on a silicon substrate in which have been formed an p-doped channel and n-doped source and drain regions. After discussing the prior art nMOSFET, the method of the invention will be discussed in the context of an nMOSFET with a gate electrode formed of low affinity material.

Referring first to FIG. 1, there is shown a schematic representation of the cross-section of a portion of the nMOSFET of this embodiment. The source (200), drain (40) as well as the channel (60) are formed in a silicon substrate (100). The gate electrode (80) is formed over a thin dielectric layer (110), which is a layer of silicon oxide in this embodiment. It is noted that the layer (110) is shown, quite generally, as extending laterally past the gate electrode, but in practice it may be removed from all portions of the substrate except beneath the electrode. Double-ended arrows (120) depict leakage currents which may be from gate to channel or channel to gate, or both. Also shown is a gate/source overlap region (140), in which leakage currents may also be found and are shown by the arrow (160).

Referring next to FIG. 2 (prior art), there is shown a typical energy band diagram for the gate-dielectric-channel junction of FIG. 1, when the materials of the gate and channel are not chosen in accord with the present invention, but are in accord with the prior art. The horizontal axis represents distance, with the positive direction going from the gate to the channel. The vertical axis, E, represents electron energy for the electrons within each of the materials. The dashed horizontal line (1) at the upper end of the energy axis is the vacuum energy, the energy of an electron that is free of the device material. The vacuum energy may be taken as zero, and the energy of the electrons within the material is negative with respect to the vacuum. The region to the left of (2) on the x-axis represents the energies of electrons in the gate electrode of heavily n-doped polycrystalline silicon, the region between (2) and (6) on the x-axis is the energy of electrons in the dielectric layer of silicon oxide and the region to the right of (6) on the x-axis is the energy of electrons in the channel region of p-doped crystalline silicon. The horizontal lines (8) and (10) are, respectively, the upper edge of the valence band and the lower edge of the conduction band of the n-doped gate electrode. The sloped lines (12) and (14) are, respectively, the corresponding band edges within the oxide layer, whose width (15) is denoted as $t_{ox}$. The wide energy gap between these lines is an indication of the fact that the oxide is an insulator. The curved lines (16) and (18) are, respectively, the upper valence band edge and lower conduction band edge of the p-doped channel. The gate has been positively biased to bring the channel into its inversion regime. The inversion is evidenced by the downward curve of the band edges (16) and (18), and the downward slope of (12) and (14) indicating the presence of an electric field that draws electrons (20) to the channel-dielectric interface (22) to form an inversion layer. The energies of the electrons in the inversion layer are the same as available energy levels in the conduction band of the gate electrode, i.e., to energies above the band edge (10). The electrons can, therefore, tunnel across the oxide to the available conduction band states in the gate electrode, to produce a current as shown by the arrow (24). Also indicated on the diagram as arrows (26) and (28), for future reference, is the electron affinity of the gate, $\chi_G$, and for the channel, $\chi_C$, which is the difference between the conduction band edge energy and the vacuum energy for electrons in the two materials. It is to be noted that the electron affinity of the gate material is about the same or greater than the electron affinity of the channel material, which is typical for materials used in the prior art.

Referring next to FIG. 3, there is shown a band diagram analogous to that of FIG. 2, except that the gate material is chosen to have a smaller affinity than the channel material in accord with the objects of this invention. The gate material whose band structure is represented in this figure as well as in FIGS. 4 and 5 below, is chosen to have an electron affinity, $\chi_G$, which is less than that of the channel material, $\chi_C$, by $V_{DD}$-0.3 electron volts (eV). For a channel material that is silicon, for which $\chi_C$ is approximately 4.2 eV, $\chi_G$ should be less than 4.5-$V_{DD}$ in eV. If, for example, $V_{DD}$=0.6 V, then $\chi_G$, should be less than 3.9 eV. The use of such a low affinity gate material is novel in the art of MOSFET fabrication, but such materials are known to exist and have been used in the fabrication of other semiconductor devices. H. Mimura et al. ("Enhancement in electron emission from polycrystalline silicon field emitter arrays coated with diamondlike carbon", J. Appl. Phys., Vol. 84, No. 6, 15 Sep. 1998, pp. 3378–3381) reports that diamondlike carbon coated polysilicon has an affinity of 2.9 eV. C. I. Wu et al. ("GaN (0001)-(1×1) surfaces: Composition and electronic properties", J. Appl. Phys., Vol. 83, No. 8, 15 Apr. 1998, pp. 4249–4252) report that the compound semiconductor GaN has an affinity of 3.5 eV while V. M. Bermudez et al. ("AlN films on GaN: Sources of error in the photoemission measurement of electron affinity", J. Appl. Phys., Vol. 89, No. 3, 1 Feb. 2001, p. 1991) reports that AlN has an affinity of 1.9 eV. There are also materials with negative affinities, whose vacuum energy is below their conduction band energy edge, which can also be used. C. Ronning et al. ("Structural and electronic properties of boron nitride thin films containing silicon", J. Appl. Phys., Vol. 84, No. 9, 1 Nov. 1998, pp. 5046–5051) and J. van der Weide et al. ("Negative-electron-affinity effects on the diamond (100) surface," Phys. Rev. B, Vol. 50 No. 8, 15 Aug. 1994-II, pp. 5803–5806) both report on such materials.

As can be seen in the figure, the gate electrode has been biased at the threshold voltage (the voltage at which inversion first occurs) of the system, $V_G=V_T$, which is typically in the range between 0.2 and 0.5 volts. As the figure shows, the Fermi level, $E_{FG}$, of the p-doped gate material (30) is lower than that of the p-doped semiconductor channel region, $E_{FS}$, (32) by the bias voltage. The difference between the conduction band edge of the gate material (14) and the conduction edge band of the channel material (18) at the oxide interface is given by: $(\chi_C-\chi_G)-V_{ox}$, where $V_{ox}$ is the voltage across the oxide layer (36), which is typically between 0 and 0.3 volts, with larger values generally being associated with larger applied voltages. The electrons (40) in the inversion layer, therefore, have energies that fall within the band gap of the gate electrode where there are no tunneling states available. This eliminates a major source of gate leakage current.

Note that if the gate material is a $p^+$ doped semiconductor, the gate will be in a state of accumulation when the p-doped channel is biased into inversion. Typical holes (42) in accumulation are shown in the gate band diagram. These holes have no corresponding tunneling states in the channel material across the oxide layer since the band gap region is there. Therefore, a further benefit of using this gate material is that a leakage current of holes is also suppressed.

Figure 4:
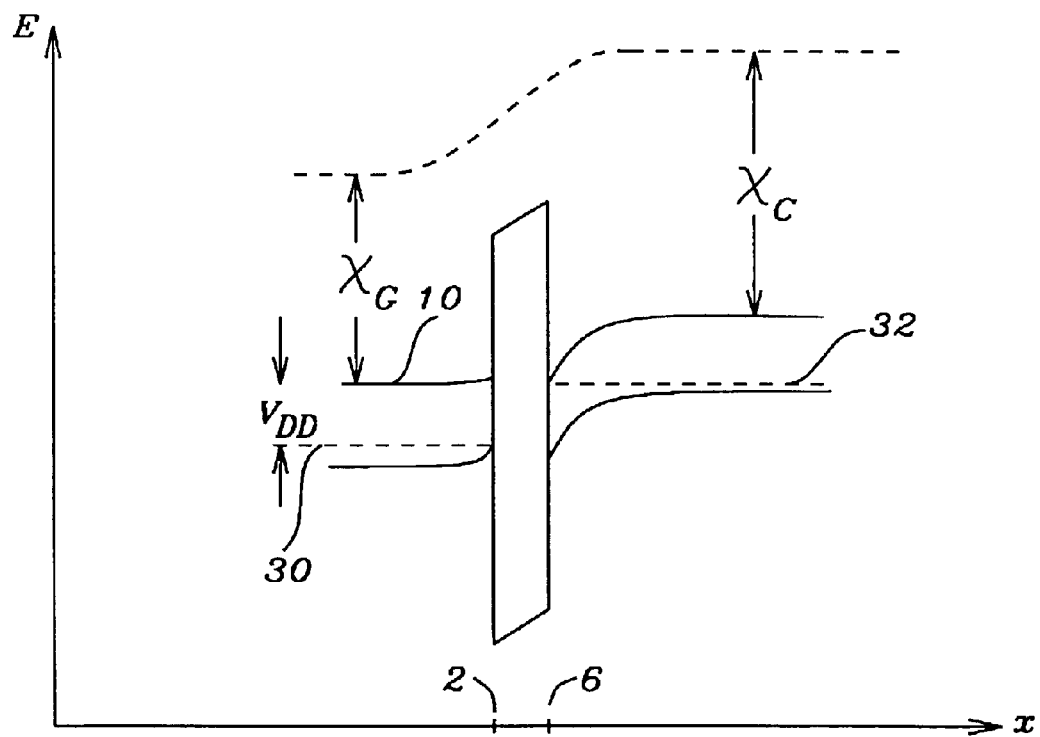
FIG. 4 is a schematic diagram of the energy band structure of the same configuration, now biased at $V_{DD}$.

Referring next to FIG. 4, there is shown the energy band diagram of the same device as in FIG. 3, but now being biased at a gate voltage equal to the drain supply voltage, $V_G=V_{DD}$. This corresponds to the worst case for gate leakage, since the lower edge of the gate conduction band (10) is approximately in line with the Fermi level, $E_{FS}$, of the channel (32), which is above the Fermi level of the gate, $E_{FG}$, (30) by the bias voltage $V_{DD}$. If $(\chi_C-\chi_G)>V_{ox}$, in accord with the invention, $E_{FS}$ will lie below the gate conduction band edge and the leakage current will be significantly reduced.

Figure 5:
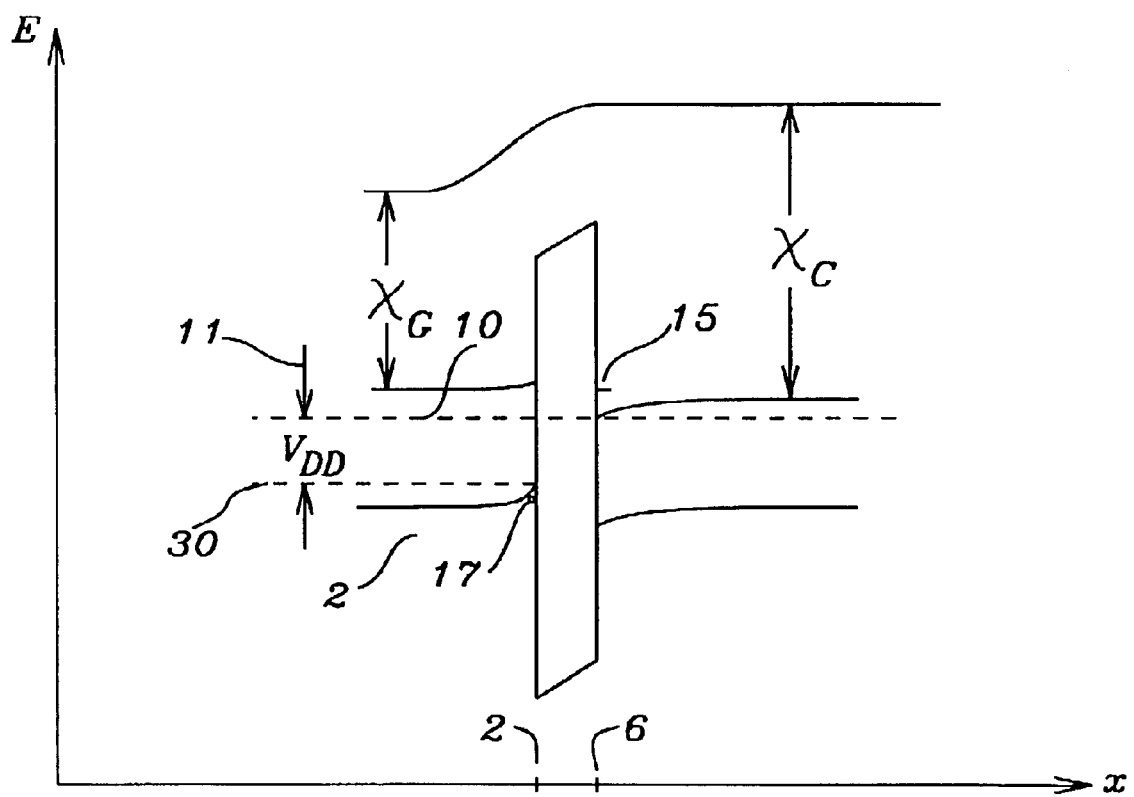
FIG. 5 is a schematic representation of the energy band structure in the gate/source overlap region of the MOSFET of FIGS. 1&2. Here the source is biased at zero and the gate is biased at $V_{DD}$.

Referring finally to FIG. 5, there is shown the band diagram for the gate-source overlap region. The band structure of the source is on the right of (6), the band structure of the oxide region, between (2) and (6), is in the center and the band structure of the gate electrode is on the left of (2). In this diagram the transistor gate electrode is biased at $V_G=V_{DD}$ (full drive voltage) and the source voltage is zero, $V_S=0$, giving a corresponding displacement (11) of their Fermi levels, (10) and (30), by $V_{DD}$. In this example, both the source region and the gate electrode are in accumulation and a typical source electron (15) is shown in the accumulation layer against the oxide layer and a typical gate electrode hole (17) is also shown. Because of the positioning of the bands, there are no available tunneling states for either the holes or the electrons, so leakage between gate and source due to direct tunneling is suppressed.

When the gate is negatively biased, the leakage current consists of electrons tunneling from the gate. Since the gate is $p^+$ doped, the tunneling current must consists of electrons from the valence band of the gate rather than its conduction band. Since the energy barrier for valence band electrons tunneling to the transistor source, drain or channel regions is very high, the tunneling current for negative biased is greatly reduced. In the case of gate to drain tunneling under zero gate bias ($V_G=0$) and maximum drain bias ($V_D=V_{DD}$), both the gate and drain regions are depleted. The lack of free carriers in the vicinity of the dielectric at the gate-drain overlap region would, therefore, greatly suppress current leakage.

The embodiment just presented provides the objects of the present invention by the use of gate electrode materials with lower electron affinity than that of the of the transistor body. As noted, this can be accomplished by using material with low or with negative electron affinities. A second embodiment achieves the objects of the invention by increasing the electron affinity of the body material relative to that of the gate electrode material. Raising the electron affinity of the transistor body material can be accomplished by strain induced band splitting. Strained Si channels are known in the prior art, but their use has not been to reduce gate current leakage. The equivalent of the difference between the electron affinities of the gate and channel for a p-channel MOSFET is the difference between the valence band edges of the channel and the gate. This quantity can be enlarged by adding Ge to the Si.

As is understood by a person skilled in the art, the preferred embodiment of the present invention is illustrative of the present invention rather than limiting of the present invention. Revisions and modifications may be made to methods, materials, structures and dimensions employed in the present method for suppressing leakage currents between the gate and the source, drain and channel regions of a MOSFET, while still providing a method for suppressing leakage currents between the gate and the source, drain and channel regions of a MOSFET, in accord with the spirit and scope of the present invention as defined by the appended claims.

What is claimed is:

1. A method for forming a MOSFET type semiconductor device having significantly reduced leakage currents in either direction between a gate electrode and source, drain and channel regions formed within a semiconductor substrate, comprising:

providing a substrate of a first semiconductor material;

forming a pair of spaced apart source and drain regions of a first conductivity type in said substrate;

forming a channel region of a second conductivity type between said source and drain regions, said channel region having an electron affinity $\chi_C$;

forming a dielectric layer on the substrate, said dielectric layer covering at least said channel region;

forming a gate electrode on the dielectric layer, said gate electrode being formed of a second semiconductor material having an electron affinity $\chi_G$ and said electrode being formed substantially over the channel region but with the possibility of overlapping said source and drain regions; and wherein $\chi_G$ is less than $\chi_C$.

2. The method of claim 1 wherein the first semiconductor material is silicon.

3. The method of claim 1 wherein the dielectric layer is a layer of $SiO_2$.

4. The method of claim 1 wherein the second conductivity type is n-type.

5. The method of claim 1 wherein the first conductivity type is p-type.

6. The method of claim 1 wherein the semiconductor material of the gate electrode is diamond-like carbon.

7. The method of claim 1 wherein the semiconductor material of the gate electrode is GaN or AlN or combinations thereof.

8. The method of claim 1 wherein $\chi_G$ is negative.

9. The method of claim 8 wherein the semiconductor material of the gate electrode is cubic boron nitride (BN).

10. The method of claim 8 wherein the semiconductor material of the gate electrode is hydrogenated (100) surface diamond.

11. The method of claim 1 wherein the channel region is Si, whose electron affinity has been increased by the addition of Ge.

12. The method of claim 1 wherein the gate electrode material is heavily p-doped polysilicon.

13. The method of claim 1 wherein the gate electrode is of a second conductivity type.

14. The method of claim 1 wherein the gate electrode is of a first conductivity type.

* * * * *